(12) United States Patent  
Kim

(10) Patent No.: US 9,129,984 B2  
(45) Date of Patent: Sep. 8, 2015

(54) THREE DIMENSIONAL SEMICONDUCTOR DEVICE HAVING LATERAL CHANNEL AND METHOD OF MANUFACTURING THE SAME

(71) Applicant: SK hynix Inc., Gyeonggi-do (KR)

(72) Inventor: Suk Ki Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/074,452

(22) Filed: Nov. 7, 2013

(65) Prior Publication Data

US 2015/0028425 A1  Jan. 29, 2015

(30) Foreign Application Priority Data

Jul. 26, 2013  (KR) .................. 10-2013-0088910

(51) Int. Cl.
*H01L 29/66* (2006.01)
*H01L 45/00* (2006.01)
*H01L 27/22* (2006.01)
*H01L 27/24* (2006.01)

(52) U.S. Cl.
CPC ........ *H01L 29/66477* (2013.01); *H01L 27/228* (2013.01); *H01L 27/2436* (2013.01); *H01L 27/2463* (2013.01); *H01L 45/04* (2013.01); *H01L 45/06* (2013.01); *H01L 45/126* (2013.01); *H01L 45/1233* (2013.01); *H01L 45/14* (2013.01); *H01L 45/141* (2013.01); *H01L 45/147* (2013.01); *H01L 45/16* (2013.01)

(58) Field of Classification Search
CPC ... H01L 27/24; H01L 27/1112; H01L 27/115; H01L 27/222; H01L 27/226; H01L 27/228; H01L 21/823431; H01L 21/8239; H01L 21/845; H01L 27/06; H01L 45/00; H01L 29/82; H01L 29/66477; H01L 27/2463; H01L 45/16; H01L 27/2436; H01L 45/141; H01L 45/04; H01L 45/147; H01L 45/1233; H01L 45/14; H01L 45/06; H01L 45/126; G11C 11/00; G11C 13/0004
USPC ..................................................... 257/2, 4, 5
See application file for complete search history.

(56) References Cited

U.S. PATENT DOCUMENTS

| | | | |
|---|---|---|---|
| 7,560,756 B2 * | 7/2009 | Chau et al. ..................... 257/287 |
| 7,704,787 B2 * | 4/2010 | Hideki et al. .................. 438/102 |
| 8,426,923 B2 * | 4/2013 | Lee et al. ....................... 257/365 |
| 8,604,546 B1 * | 12/2013 | Bryant et al. ................. 257/347 |
| 8,665,629 B2 * | 3/2014 | Park et al. ..................... 365/148 |

(Continued)

FOREIGN PATENT DOCUMENTS

KR    1020130104527    9/2013

*Primary Examiner* — Yu Chen
*Assistant Examiner* — Nilufa Rahim
(74) *Attorney, Agent, or Firm* — IP & T Group LLP

(57) ABSTRACT

A 3D semiconductor device and a method of manufacturing the same are provided. The 3D semiconductor device includes a semiconductor substrate, an insulating layer formed on the semiconductor substrate, an active line including a source region and a drain region formed on the insulating layer, a gate electrode located on a portion of the active line, corresponding to a region between the source region and the drain region, and extending to a direction substantially perpendicular to the active line, and a line-shaped common source node formed to be electrically coupled to the source region and extending substantially in parallel to the gate electrode in a space between gate electrodes.

10 Claims, 16 Drawing Sheets

(56) References Cited

U.S. PATENT DOCUMENTS

| | | | |
|---|---|---|---|
| 2005/0282342 A1* | 12/2005 | Adan | 438/294 |
| 2007/0217318 A1* | 9/2007 | Nirschl et al. | 369/163 |
| 2010/0046287 A1* | 2/2010 | Widjaja | 365/163 |
| 2012/0068149 A1* | 3/2012 | Kakoschke et al. | 257/5 |
| 2012/0153387 A1* | 6/2012 | Murthy et al. | 257/335 |
| 2012/0267595 A1* | 10/2012 | Fang et al. | 257/2 |
| 2013/0241000 A1* | 9/2013 | Lee et al. | 257/379 |
| 2014/0103455 A1* | 4/2014 | Ando et al. | 257/410 |

\* cited by examiner

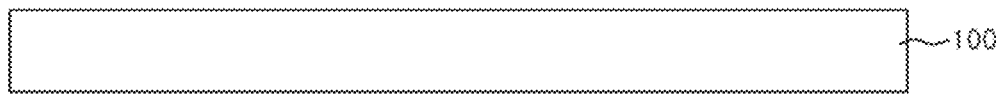
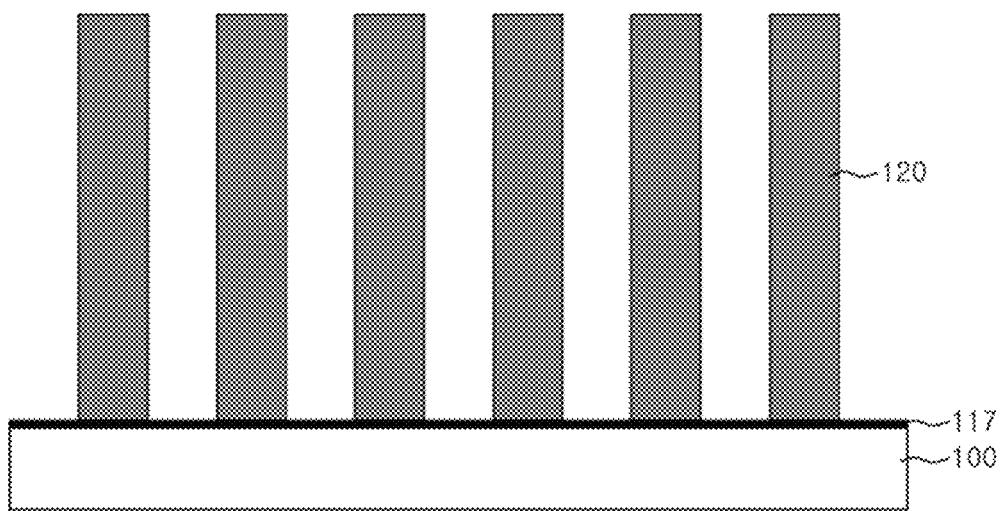

THREE DIMENSIONAL SEMICONDUCTOR DEVICE HAVING LATERAL CHANNEL AND METHOD OF MANUFACTURING THE SAME

CROSS-REFERENCES TO RELATED APPLICATION

This application claims priority under 35 U.S.C. 119(a) to Korean application No. 10-2013-0088910, filed on Jul. 26, 2013, in the Korean patent intellectual property Office, which is incorporated by reference in its entirety as set forth in full.

BACKGROUND

1. Technical Field

The inventive concept relates to a semiconductor integration circuit device, and more particularly, to a semiconductor device having a three-dimensional (3D) lateral channel and a method of manufacturing the same.

2. Related Art

With the rapid development of mobile and digital information communication and consumer electronic industry, studies on existing electronic charge controlled devices may encounter limitations. Thus, new functional memory devices of novel concepts other than the existing electronic charge devices need to be developed. In particular, next generation memory devices with large capacity, ultra-high speed, and ultra-low power need to be developed.

Currently, resistance variable memory devices using a resistance device as a memory medium have been suggested as the next generation memory devices. Typical examples of resistive variable memory devices are phase-change random access memories (PCRAMs), resistance RAMs (ReRAMs), and magentoresistive RAMs (MRAMs).

Each of the resistance variable memory devices may be basically formed of a switching device and a resistance device and store data "0" or "1" according to a state of the resistance device.

Even in the resistive variable memory devices, the first priority is to improve integration density and to integrate as many memory cells as possible in a limited small area.

Currently, methods of forming the resistance variable memory devices in 3D structures are suggested, and demands on methods of stably stacking a plurality of memory cells with a narrow critical dimension are growing.

As a manufacturing method of a typical 3D structure resistance variable memory device, there is a method of manufacturing a switching device using a vertical pillar. However, the method of manufacturing a switching device using the vertical pillar may have a concern in that a fabrication process of the switching device is complex, and an aspect ratio is increased due to a height of the vertical pillar, and thus the semiconductor device is structurally unstable.

To alleviate this concern of the 3D vertical pillar structure, a 3D lateral channel structure is suggested. The 3D lateral channel structure is a structure in which an active region having a lateral channel (a lateral fin structure or a lateral channel region) in a 3D structure is formed on a semiconductor substrate unlike an existing buried type. In this 3D lateral channel semiconductor device, in general, the lateral fin structure is electrically coupled to the semiconductor substrate through a common source node.

However, a manufacturing process of the 3D lateral channel semiconductor device may include a process of aligning a channel of the active region with the common source node, and a process of aligning a gate (a word line) with the channel of the active region. Therefore, a process defect such as misalignment may occur in the manufacturing process.

SUMMARY

According to an exemplary embodiment of the present invention, there is provided a semiconductor device. The semiconductor device may include a semiconductor substrate, an insulating layer formed on the semiconductor substrate, an active line including a source region and a drain region formed on the insulating layer, a gate electrode located on a portion of the active line, corresponding to a region between the source region, and the drain region and extending to a direction substantially perpendicular to the active line, and a line-shaped common source node formed to be electrically coupled to the source region and extending substantially in parallel to the gate electrode in a space between gate electrodes.

According to an exemplary embodiment of the present invention, there is provided a semiconductor device. The semiconductor device may include a semiconductor substrate, a plurality of active lines floating over the substrate and extending in parallel to a first direction, a plurality of gate electrodes formed on each of the active lines and extending in parallel to a second direction that is substantially perpendicular to the first direction, a plurality of line-shaped common source nodes formed on each of the active lines, extending in parallel to the second direction, and located between the gate electrodes, drain regions formed in each of the active lines at one sides of the gate electrodes, and source regions formed in each of the active lines at the other sides of the gate electrodes.

According to an exemplary embodiment of the present invention, there is provided a method of manufacturing a semiconductor device. The method may include sequentially stacking a first semiconductor layer and a second semiconductor layer on a semiconductor substrate, forming an active line by patterning the second semiconductor layer and the first semiconductor layer, forming a source region and a drain region in predetermined regions of the active line; entirely oxidizing the first semiconductor layer constituting the active line, and forming an insulating layer on a surface of the second semiconductor layer; forming line-shaped dummy patterns crossing the active line to pass through the source region and the drain region, forming a gate electrode in a region between the line-shaped dummy patterns, selectively removing the line-shaped dummy pattern passing through the source region, and forming a line-shaped common source node in a region from which the line-shaped dummy pattern is removed.

Further, a hard mask layer may be formed on the gate electrode between the forming of the gate electrode and the removing of the dummy pattern.

Further, the source region and the drain region may be exposed by selectively removing a dummy pattern on the drain region simultaneously in the selectively removing of the dummy pattern passing through the source region. And then, a heating electrode may be formed on the exposed drain region simultaneously in the forming of the common source node.

Further, a spacer insulating layer may be formed on the heating electrode and the common source node to expose the heating electrode and shield the common source node, and resistance variable material layers may be formed on the heating electrode and the common source node.

These and other features, aspects, and embodiments are described below in the section entitled "DETAILED DESCRIPTION".

BRIEF DESCRIPTION OF THE DRAWINGS

The above and other aspects, features and other advantages of the subject matter of the present disclosure will be more clearly understood from the following detailed description taken in conjunction with the accompanying drawings, in which:

FIGS. 3A to 3E are cross-sectional views illustrating the method of manufacturing the semiconductor device having the 3D lateral channel shown in FIGS. 1A to 1E, taken along lines III-III' of FIGS. 1A to 1E;

DETAILED DESCRIPTION

Figure 1A:
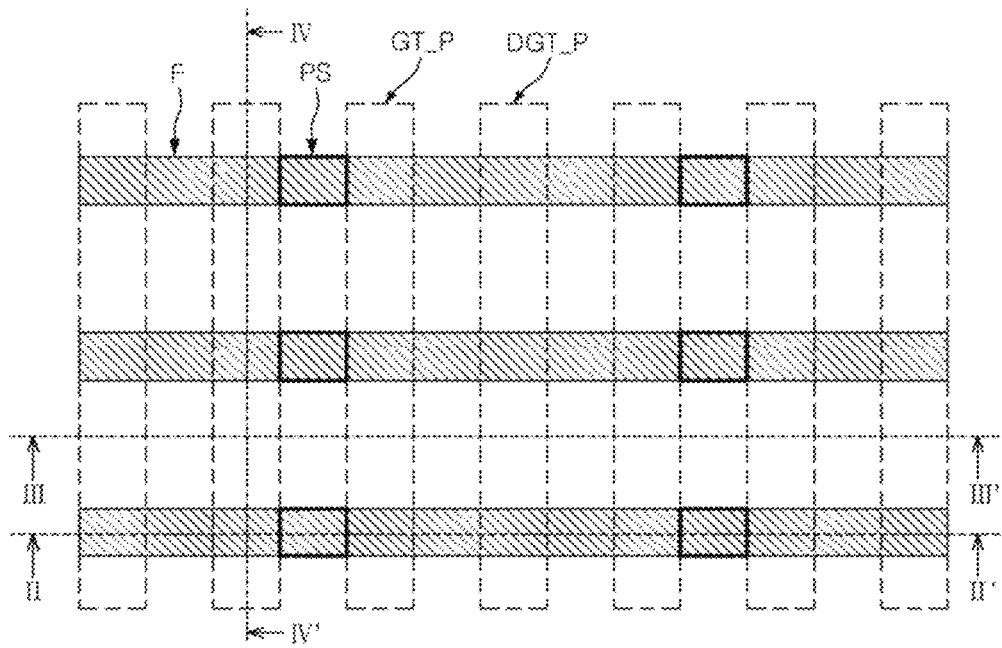
FIGS. 1A to 1E are plan views illustrating a method of manufacturing a semiconductor device having a 3D lateral channel according to an embodiment of the inventive concept.
Figure 1B:
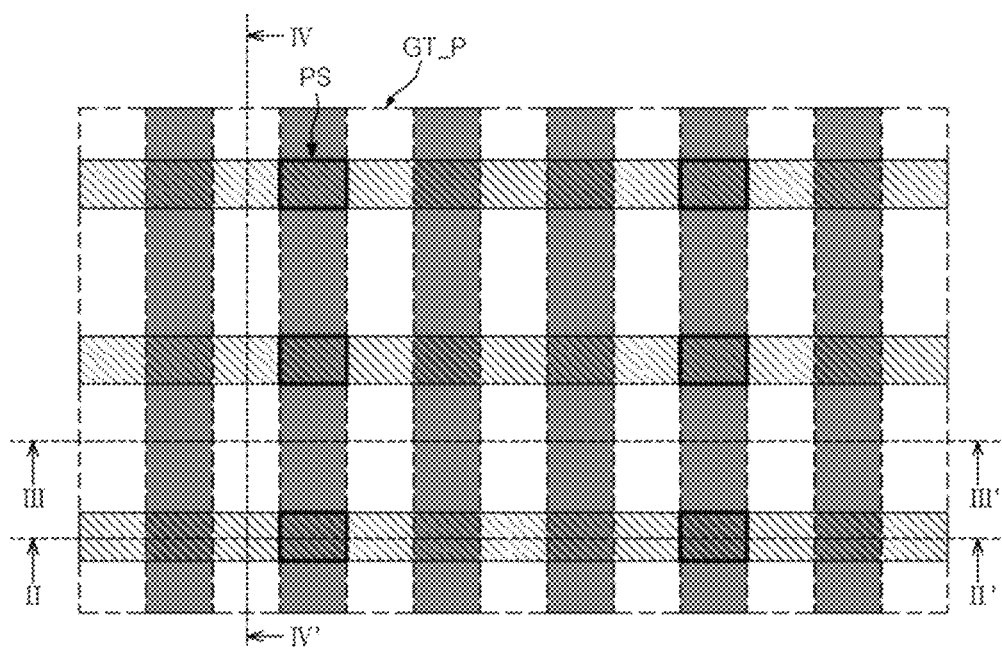
Figure 1C:
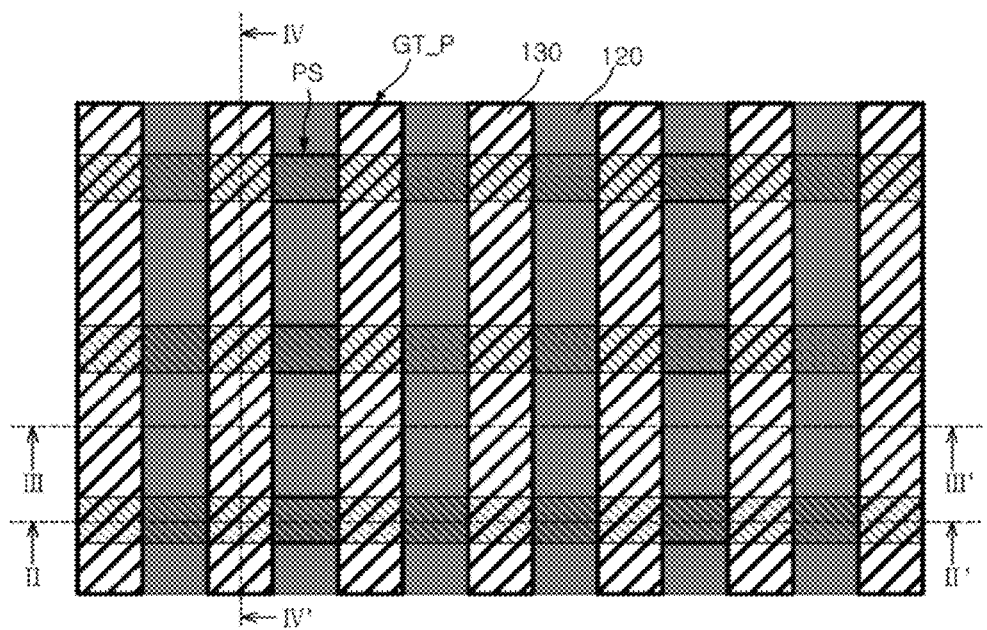
Figure 1D:
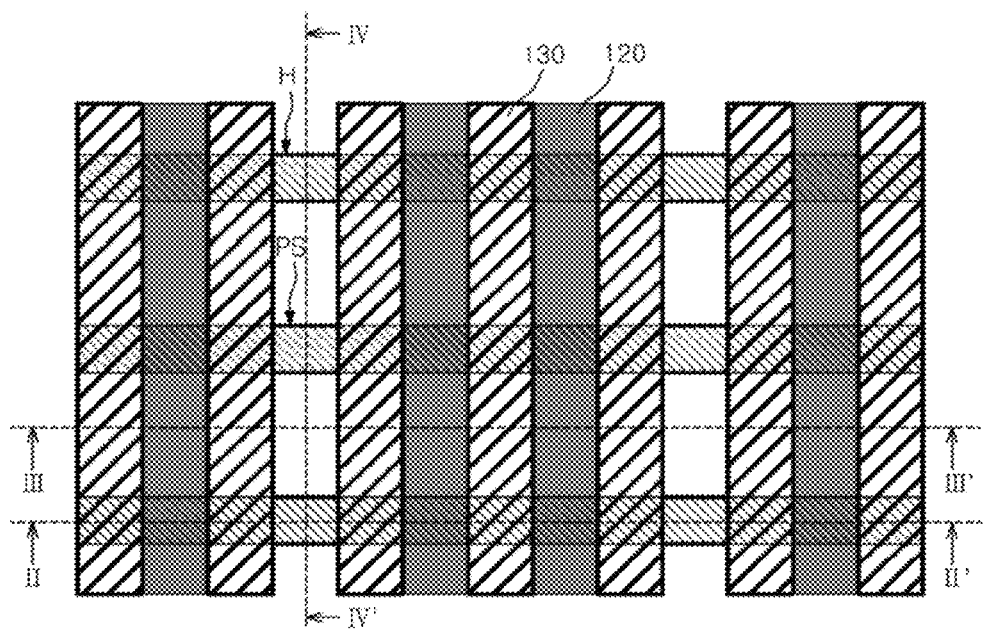
Figure 1E:
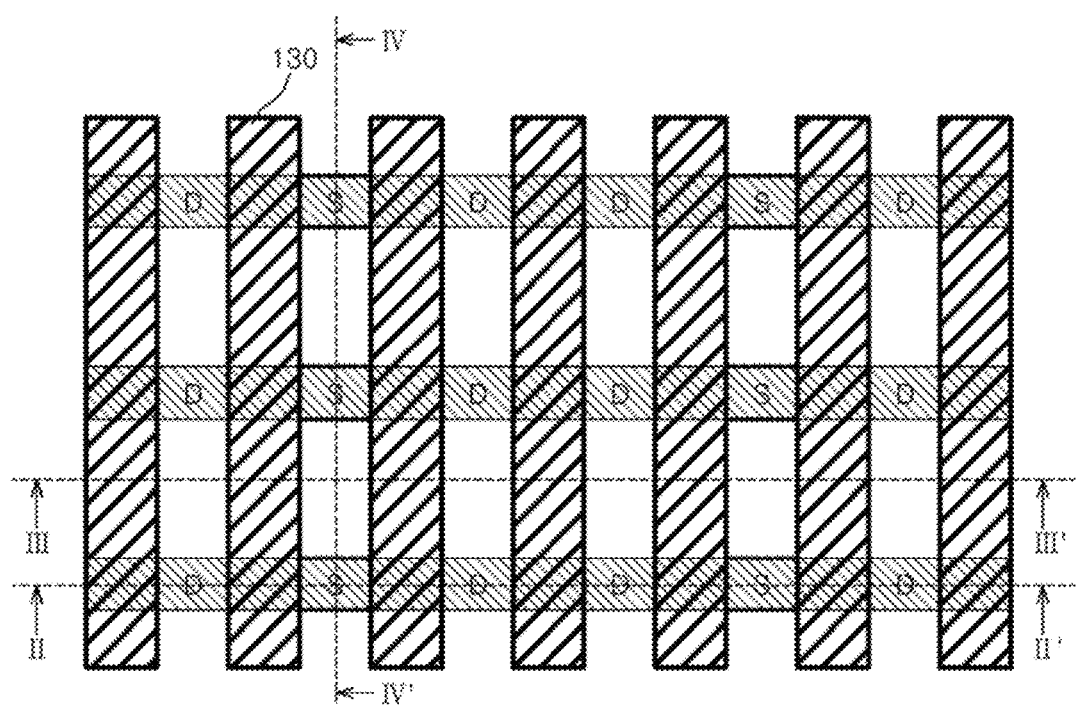
Figure 2A:
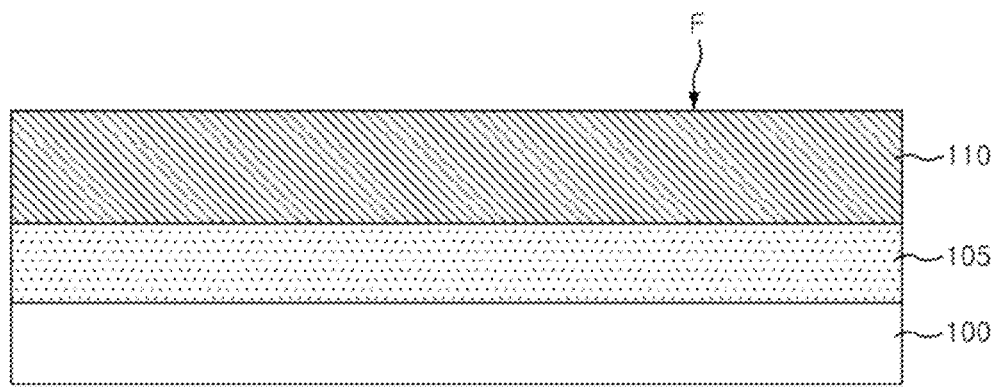
FIGS. 2A to 2E are cross-sectional views illustrating the method of manufacturing the semiconductor device having the 3D lateral channel shown in FIGS. 1A to 1E, taken along lines II-II' of FIGS. 1A to 1E.
Figure 2B:
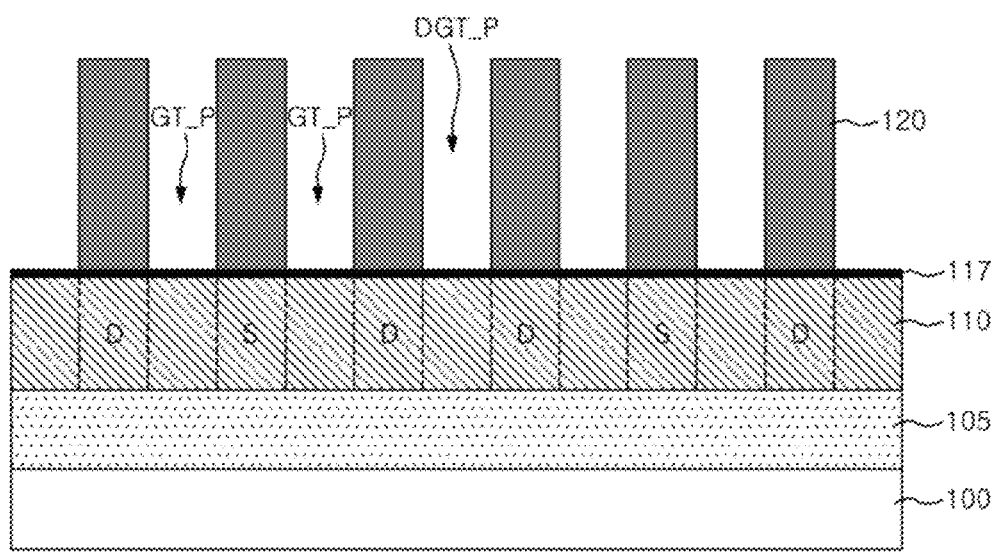
Figure 2C:
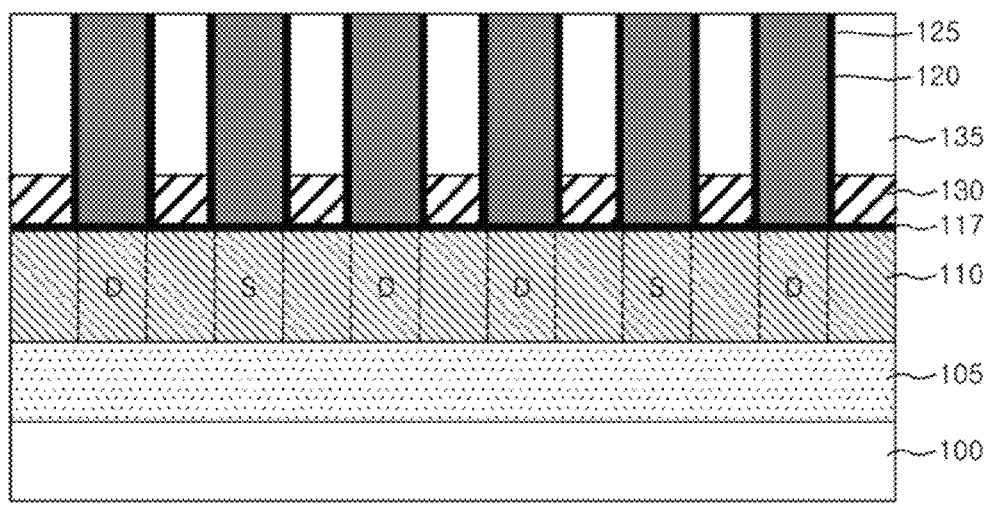
Figure 2D:
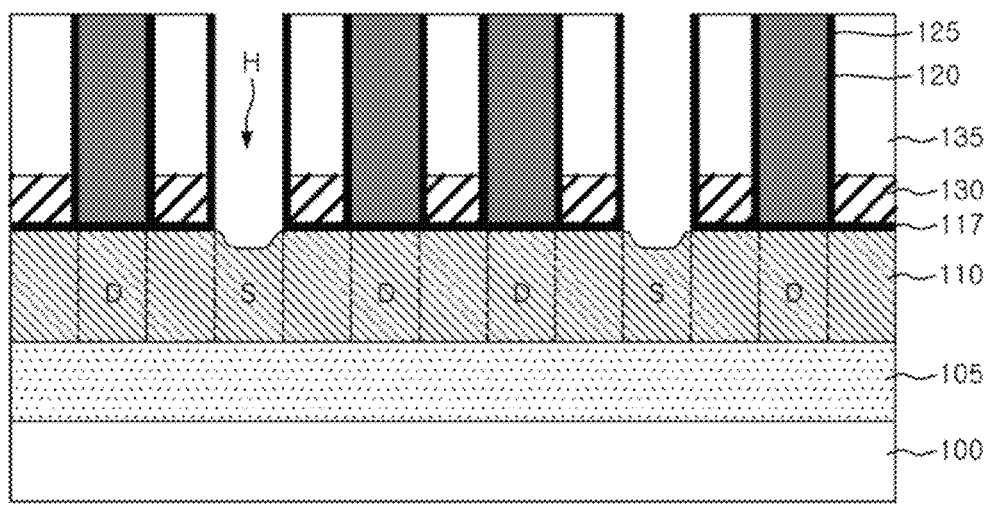
Figure 2E:
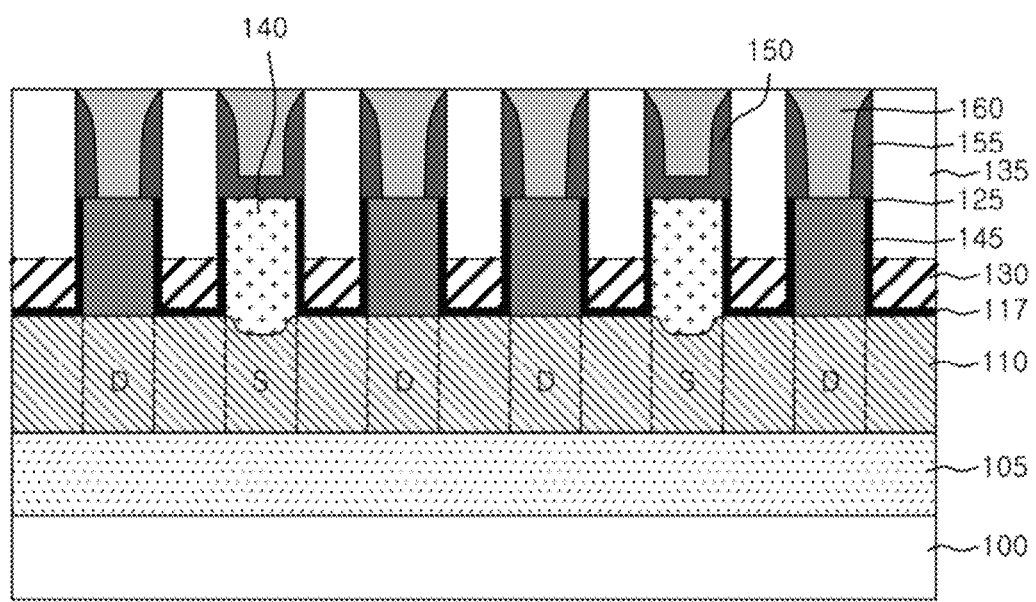
Figure 3C:
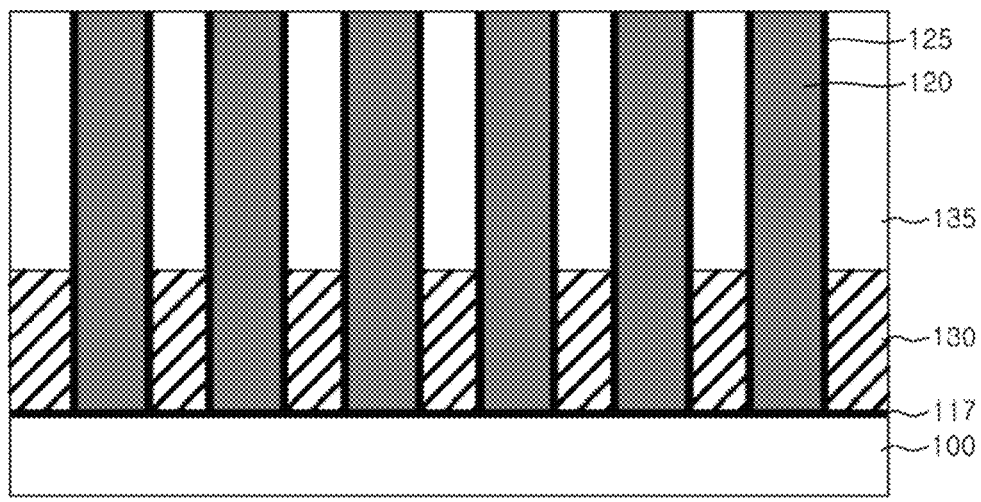
Figure 3D:
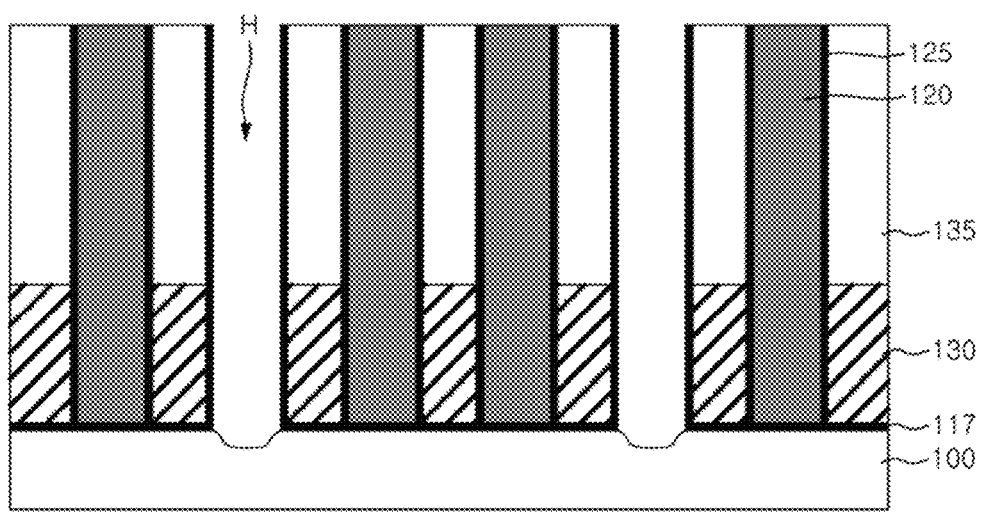
Figure 3E:
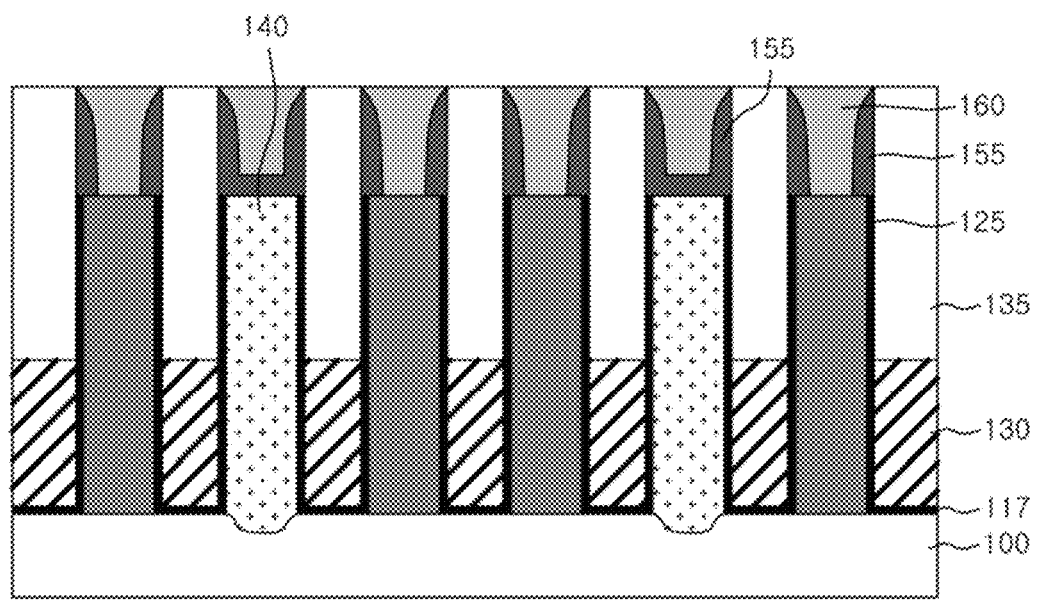

Hereinafter, exemplary embodiments will be described in greater detail with reference to the accompanying drawings. Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. In the drawings, lengths and sizes of layers and regions may be exaggerated for clarity. Like reference numerals in the drawings denote like elements. It is also understood that when a layer is referred to as being "on" another layer or substrate, it can be directly on the other layer or substrate, or intervening layers may also be present. It is also noted that in this specification, "connected/coupled" refers to one component not only directly coupling another component but also indirectly coupling another component through an intermediate component. In addition, a singular form may include a plural form as long as it is not specifically mentioned in a sentence.

The inventive concept is described herein with reference to cross-section and/or plan illustrations that are schematic illustrations of idealized embodiments of the inventive concept. However, embodiments of the inventive concept should not be limited construed as limited to the inventive concept. Although a few embodiments of the inventive concept will be shown and described, it will be appreciated by those of ordinary skill in the art that changes may be made in these exemplary embodiments without departing from the principles and spirit of the inventive concept.

In the embodiment, a resistance variable memory device among semiconductor devices will be described as an example.

Referring to FIGS. 1A, 2A, 3A, and 4A, a first semiconductor layer 105 and a second semiconductor layer 110 may be sequentially formed on a semiconductor substrate 100. The first semiconductor layer 105 and the second semiconductor layer 110 may be formed of materials having etching selectivities and oxidation rates different from each other. The first semiconductor layer 105 may be a layer for defining a common source node in a subsequent process, and may include, for example, a silicon germanium (SiGe) layer. The second semiconductor layer 110 may be a layer in which a junction region and a channel region are to be formed, and formed thicker than the first semiconductor layer 105. The first and second semiconductor layers 105 and 110 may be formed through an epitaxial growth method to have a perfect crystalline state. The second and first semiconductor layers 110 and 105 may be patterned in a fin shape to form a plurality of active lines F. Further, in FIG. 1A, GT_P may denote a gate formation region, and DGT_P may be a dummy gate formation region. A plurality of gate formation regions GT_P may extend to be parallel to each other, and may be arranged substantially to be perpendicular to the active lines F. Further, one dummy gate formation region DGT_P may be formed in an interval of every two gate formation regions GT_P to substantially separate cells. In FIG. 1A, PS may denote a common source node formation region.

Referring to FIGS. 1B, 2B, 3B, and 4B, a dummy layer may be formed on the semiconductor substrate in which the active line F is formed. The dummy layer may be patterned to be located in a line shape between the gate formation regions GT_P and between the gate formation region GT_P and the dummy gate formation region DGT_P to form a dummy pattern 120 having a line shape. The dummy pattern 120 may be formed of a conductive layer, for example, a polysilicon layer.

Before the dummy pattern 120 is formed, a source region S and a drain region D may be alternately formed in portions of the second semiconductor layer 110 corresponding to dummy patterns 120. The process of forming the source and drain regions S and D may be performed after a mask is formed on the gate formation region GT_P and the dummy gate formation region DGT_P.

Figure 4A:
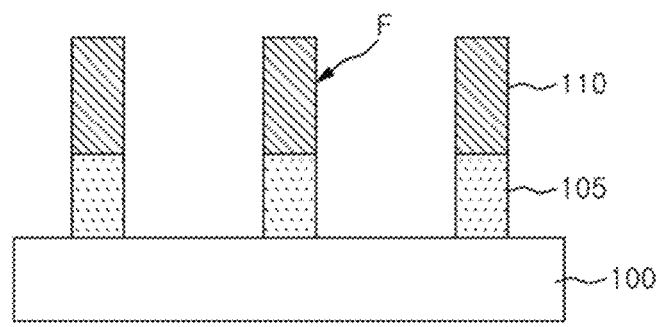
FIGS. 4A to 4E are cross-sectional views illustrating the method of manufacturing the semiconductor device having the 3D lateral channel shown in FIGS. 1A to 1E, taken along lines IV-IV' of FIGS. 1A to 1E.
Figure 4B:
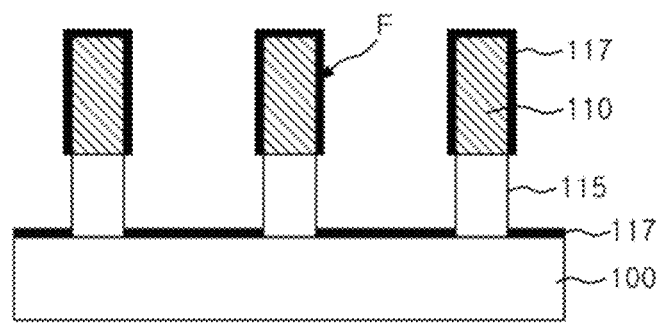
Figure 4C:
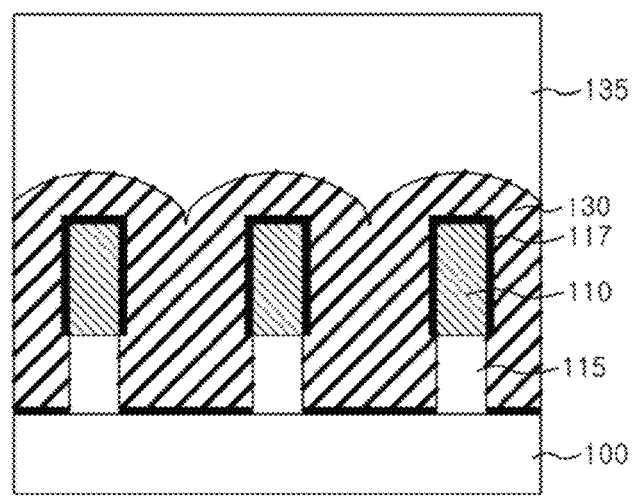

An oxidation process may be performed on the exposed semiconductor substrate 100 to form first and second insulating layers 115 and 117 between the process of forming the source and drain regions S and D and the process of forming the dummy pattern 120. The first insulating layer 115 may be obtained by oxidizing the first semiconductor layer 105. The oxidation of the first semiconductor layer 105 may be performed by supplying oxygen through an exposed side of the semiconductor layer 105. Further, the second insulating layer 117 may be obtained by oxidizing surfaces of the semiconductor substrate 100 and the second semiconductor layer 110. For example, the first semiconductor layer 105 may be formed of a SiGe material, and the second semiconductor layer 110 and the semiconductor substrate 100 may be formed of a silicon (Si) material. In this case, since the SiGe material has an oxidation rate greater than that of the Si material, the second insulating layer 117 that is thinner than the first insulating layer 115 may be formed on the second semiconductor layer 110 and the semiconductor substrate 100, while the first semiconductor layer 105 is entirely oxidized to form the first insulating layer 115. Further, as illustrated in FIG. 4B, the second insulating layer 117 may be formed on an entire surface of the second semiconductor layer 110.

The process of forming the source and drain regions S and D and the process of forming the first and second insulating layers may be interchangeably performed.

Referring to FIGS. 1C, 2C, 3C, and 4C, an oxide layer 125 may be formed on an exposed surface of the dummy pattern 120. Next, a gate conductive layer is formed in the gate formation region GT_P and the dummy gate formation region DGT_P. The gate conductive layer may include a metal material, for example, one or more materials selected from the group consisting of tungsten (W), copper (Cu), titanium nitride (TiN), tantalum nitride (TaN), tungsten nitride (WN), molybdenum nitride (MoN), niobium nitride (NbN), titanium silicon nitride (TiSiN), titanium aluminum nitride (TiAlN), titanium boron nitride (TiBN), zirconium silicon nitride (ZrSiN), tungsten silicon nitride (WSiN), tungsten boron nitride (WBN), zirconium aluminum nitride (ZrAlN), molybdenum silicon nitride (MoSiN), molybdenum aluminum nitride (MoAlN), tantalum silicon nitride (TaSiN), tantalum aluminum nitride (TaAlN), titanium (Ti), molybdenum (Mo), tantalum (Ta), titanium silicide (TiSi), tantalum silicide (TaSi), titanium tungsten (TiW), titanium oxynitride (TiON), titanium aluminum oxynitride (TiAlON), tungsten oxynitride (WON), and tantalum oxynitride (TaON). The gate conductive layer may be etched back to be left in a bottom of each of the gate formation region GT_P and the dummy gate formation region DGT_P, and thus a gate electrode 130 may be formed. At this time, gate electrodes 130 may be insulated from each other by the dummy pattern 120 and the oxide layer 125. A hard mask layer 135 may be formed on the gate electrode 130. The hard mask layer 135 may be formed to be buried in each of the gate formation region GT_P and the dummy gate formation region DGT_P.

Figure 4D:
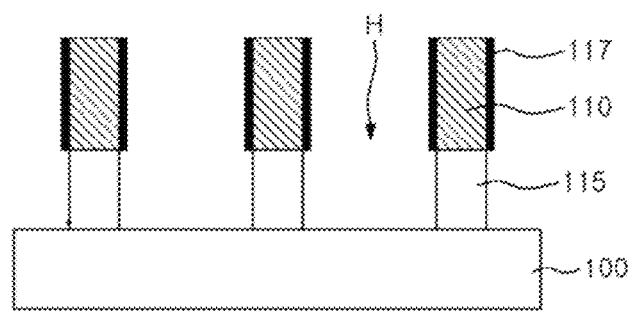
Figure 4E:
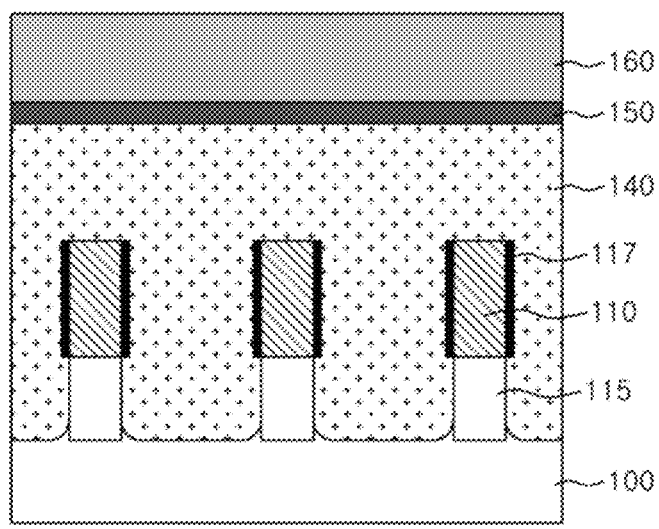

Referring to FIGS. 1D, 2D, 3D, and 4D, a dummy pattern 120 located on the common source node formation region PS may be selectively removed to form a source hole H. The process of forming the source hole H may use a mask process. The process of forming the source hole H may include an over etching process. A surface of the source region S may be partially etched through the over etching process. FIG. 4D illustrates a portion cut along the source hole H.

Referring to FIGS. 1E, 2E, 3E, and 4E, a dummy pattern 120 on the active line F, that is, a dummy pattern on the drain region D may be selectively removed, and then the second insulating layer 117 on the drain region D may be selectively removed A conductive layer may be buried in the source hole H and in a space from which the dummy pattern on the drain region D is removed. The conductive layer may include a doped polysilicon layer. The buried conductive layer may be recessed by a predetermined thickness to form a common source node 140 on the source region S and a heating electrode 145 on the drain region D. Through the recess process, variable resistor regions may be formed on the common source node 140 and the heating electrode 145.

The common source node 140 may be formed in a line shape parallel to the gate electrode 130 since the common source node 140 is formed in the source hole H. Therefore, the common source node 140 may be in contact with the source region S on the active line F, and the semiconductor substrate 100 in a space between the active lines F.

An insulating layer 150 for a spacer may be deposited on the semiconductor substrate in which the common source node 140 and the heating electrode 145 are formed. A mask pattern (not shown) may be formed to shield the insulating layer 150 for a spacer on the common source node 140. Subsequently, the exposed insulating layer 150 for a spacer on the heating electrode 145 may be etched using a general spacer etching process, for example, an anisotropical etching process to form a spacer 155 on a sidewall of a variable resistor region on the heating electrode 145.

The heating electrode 145 may be exposed by the spacer 155, and the common source node 140 may be shielded by the insulating layer 150 for a spacer. Next, the mask pattern may be removed through a general process.

A resistance variable material layer 160 may be formed to be buried in the variable resistor regions. As the resistance variable material layer 160 may include a PCMO layer for a ReRAM, a chalcogenide layer for a PCRAM, a magnetic layer for a MRAM, a magnetization reversal device layer for a spin-transfer torque magnetoresistive RAM (STTMRAM), or a polymer layer for a polymer RAM (PoRAM). The resistance variable material layer 160 may be electrically coupled to the heating electrode 145 and electrically isolated from the common source node 140.

Subsequently, although not shown, a bit line may be formed on the resistance variable material layer 160. The bit line may be formed in a direction substantially perpendicular to an extending direction of the gate electrode 130.

According to the embodiment, since the common source node 140 is formed in a line shape between the gate electrodes 130, a separate alignment process and a complex oxidation control process are not necessary. Further, since the common source node 140 is formed in such a manner that the common source node 140 of the source region S is located on the source region S, and the common source node 140 in the space between the active lines F is in contact with the semiconductor substrate 100, current may be stably provided to the semiconductor substrate 100 through the common source node 140. Therefore, the lateral channel transistor in which the common source node and the gate are formed in a self-aligned manner may be completed.

Figure 5:
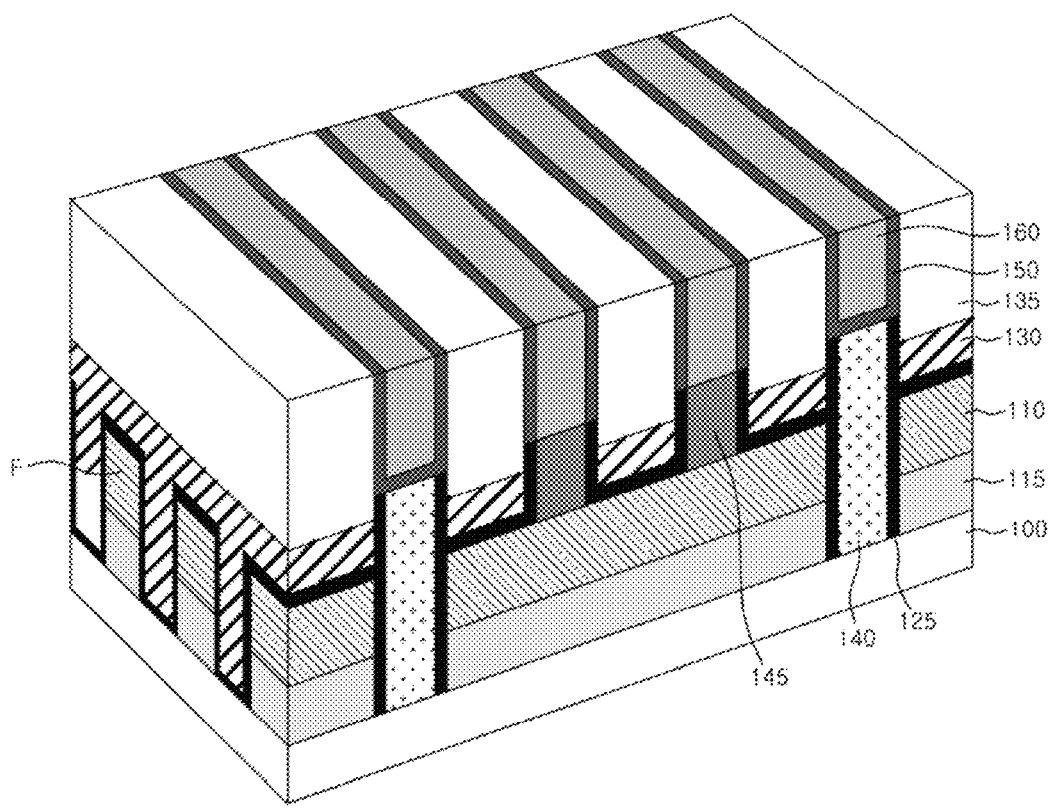
FIG. 5 is a perspective view illustrating a semiconductor device having a 3D lateral channel according to an embodiment of the inventive concept.

Referring to FIG. 5, in a semiconductor device according to the embodiment, a first insulating layer 115 and an active line F, in which a source region (not shown) and a drain region D are formed, are formed on a semiconductor substrate 100.

A gate electrode 130 may be arranged substantially to be perpendicular to the active line on F between the source region and the drain region D, and a common source node 140 may be formed between gate electrodes 130 to be in contact with the source region.

A heating electrode 145 may be formed on the drain region D, and a resistance variable material layer 160 may be formed to be electrically in contact with the heating electrode 145 and to be insulated from the common source node 140.

The semiconductor device having a 3D lateral channel according to the embodiment may include a line-shaped common source node transversally or longitudinally crossing an active line. Since the line-shaped common source node is formed without a complicated alignment process and a process of partially oxidizing a first semiconductor layer in a lower portion of the active line, a process error may be reduced. Further, an aspect ratio of the semiconductor device can be lowered using the lateral channel structure, and electrical interaction characteristics may be improved since a current discharge area is also increased according to change to the line-shaped common source node from a common source node of an existing pattern structure. With this line-shaped common source node, current may be stably provided to a semiconductor substrate, and a structural concern such as leaning may also be alleviated.

Further, a gate electrode may be formed using a metal layer, and thus conduction characteristics of the gate electrode may be improved.

Figure 6:
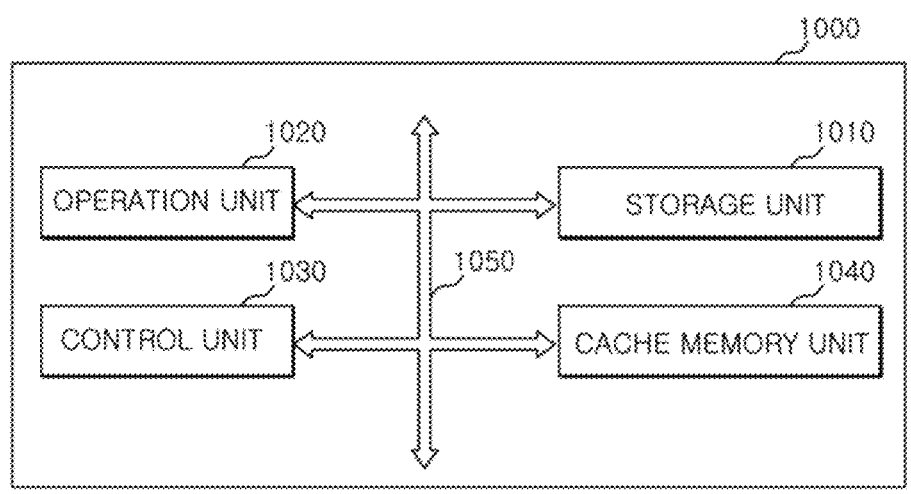
FIG. 6 is a block diagram illustrating a microprocessor according to an embodiment of the inventive concept.

As illustrated in FIG. 6, a microprocessor 1000 to which the semiconductor device according to the embodiment is applied may control and adjust a series of processes, which receive data from various external apparatuses, process the data and transmit a processing result to the external apparatuses. The microprocessor 1000 may include a storage unit 1010, an operation unit 1020, and a control unit 1030. The microprocessor 1000 may be a variety of processing apparatuses, such as a central processing unit (CPU), a graphic processing unit (GPU), a digital signal processor (DSP), or an application processor (AP).

The storage unit 1010 may be a processor register or a register, and the storage unit may be a unit that may store data in the microprocessor 1000 and include a data register, an address register, and a floating point register. The storage unit 1010 may include various registers other than the above-described registers. The storage unit 1010 may function to temporarily store data to be operated in the operation unit 1020, resulting data processed in the operation unit 1020, and an address in which data to be processed is stored.

The storage unit 1010 may include one of the semiconductor devices according to embodiments. The storage unit 1010 including the semiconductor device according to the above-described embodiment may include a 3D semiconductor device including a lateral channel structure in which a common source node is formed in a line shape.

The operation unit 1020 may be a unit suitable for performing an operation in the microprocessor 1000, and perform a variety of four fundamental rules of an arithmetic operation or a logic operation depending on a decryption result of a command in the control unit 1030. The operation unit 1020 may include one or more arithmetic and logic units (ALUs).

The control unit 1030 receives a signal from the storage unit 1010, the operation unit 1020, or an external apparatus of the microprocessor 1000, performs extraction or decryption of a command, or input or output control, and executes a process in a program form.

The microprocessor 1000 according to the embodiment may further include a cache memory unit 1040 that may temporarily store data input from or data to be output to an external apparatus other than the storage unit 1010. At this time, the cache memory unit 1040 may exchange data with the storage unit 1010, the operation unit 1020, and the control unit 1030 through a bus interface 1050.

Figure 7:
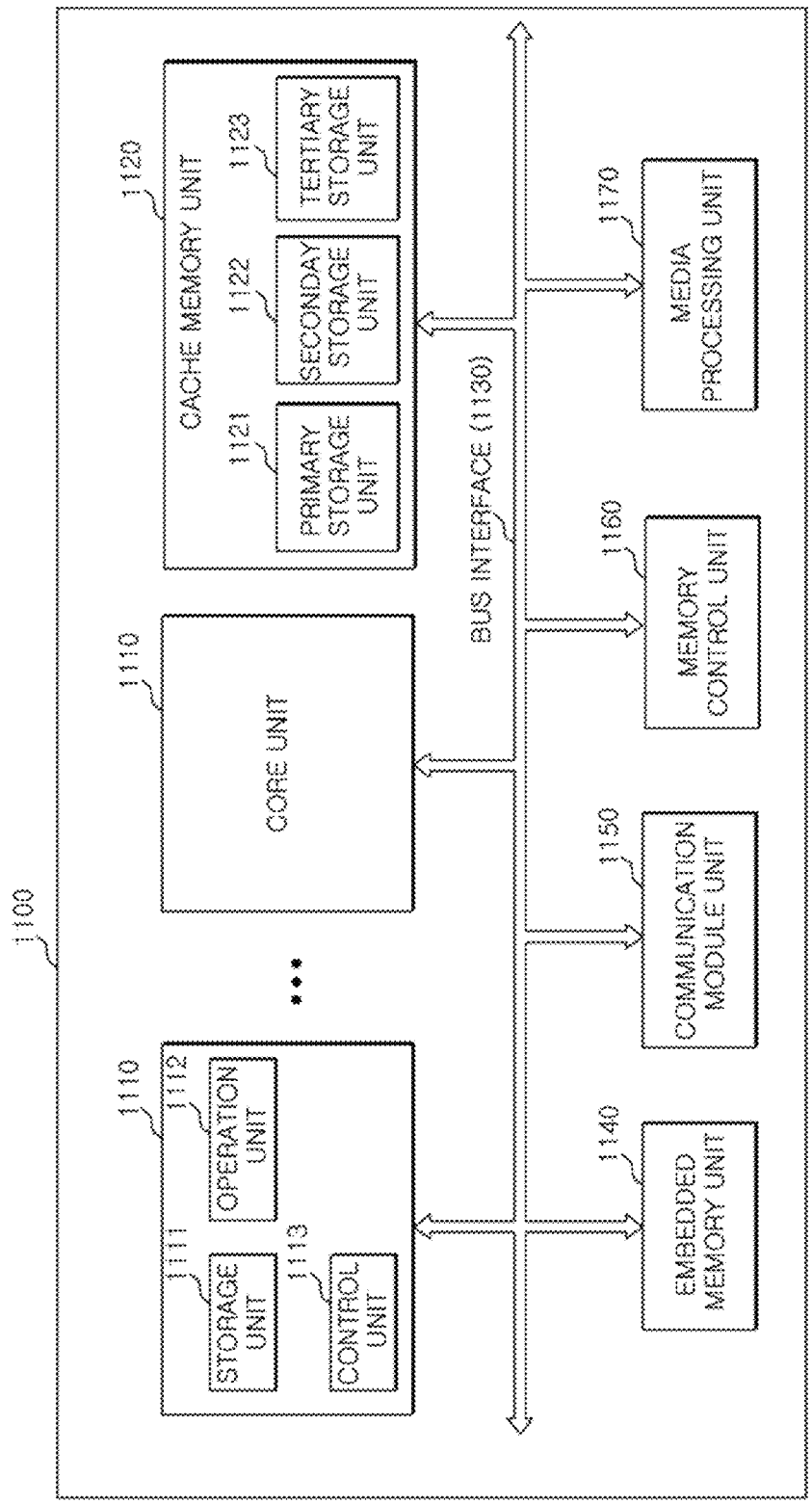
FIG. 7 is a block diagram illustrating a processor according to an embodiment of the inventive concept.

As illustrated in FIG. 7, a processor 1100 according to the embodiment may include various functions to implement performance improvement and multifunction other than the functions of the microprocessor that may control and adjust a series of processes, which receive data from various external apparatuses, process the data and transmit a processing result to the external apparatuses. The processor 1100 may include a core unit 1110, a cache memory unit 1120, and a bus interface 1130. The core unit 1110 in the embodiment is a unit that may perform an arithmetic and logic operation on data input from an external apparatus, and include a storage unit 1111, an operation unit 1112, and a control unit 1113. The processor 1100 may be a variety of system on chips (SoCs) such as a multi core processor (MCP), a GPU, and an AP.

The storage unit 1111 may be a processor register or a register, and the storage unit 1111 may be a unit that may store data in the processor 1100 and include a data register, an address register, and a floating point register. The storage unit 1111 may include various registers other than the above-described registers. The storage unit 1111 may function to temporarily store data to be operated in the operation unit 1112, resulting data processed in the operation unit 1112, and an address in which data to be processed is stored. The operation unit 1112 may be a unit that may perform an operation in the processor 1100, and perform a variety of four fundamental rules of arithmetic or a logic operation depending on a decryption result of a command in the control unit 1113. The operation unit 1112 may include one or more arithmetic and logic units (ALUs). The control unit 1113 receives a signal from the storage unit 1111, the operation unit 1112, or an external apparatus of the processor 1100, performs extraction or decryption of a command, or input or output control, and executes a process in a program form.

The cache memory unit 1120 may temporarily store data to supplement a data processing rate of a low speed external apparatus unlike the high speed core unit 1110. The cache memory unit 1120 includes a primary storage unit 1121, a secondary storage unit 1122, and a tertiary storage unit 1123. In general, the cache memory unit 1120 may include the primary and secondary storage units 1121 and 1122. When a high capacity storage unit is necessary, the cache memory unit 1120 may include the tertiary storage unit 1123. If necessary, the cache memory 1120 may include more storage units. That is, the number of storage units included in the cache memory unit 1120 may be changed according to design. Here, processing rates of data storage and discrimination of the primary, secondary, and tertiary storage units 1121, 1122, and 1123 may be the same as or different from each other. When the processing rates of the storage units are different, the processing rate of the primary storage unit is the largest. One or more of the primary storage unit 1121, the secondary storage unit 1122, and the tertiary storage unit 1123 in the cache memory unit 1120 may include one of the semiconductor devices according to embodiments. The cache memory unit 1120 including the semiconductor device according to the above-described embodiment may include a 3D semiconductor device including a lateral channel structure in which a common source node is formed in a line shape. FIG. 7 has illustrated that all the primary, secondary, tertiary storage units 1121, 1122, and 1123 are formed in the cache memory unit 1120. However, all the primary, secondary, tertiary storage units 1121, 1122, and 1123 in the cache memory unit 1120 may be formed in the outside of the core unit 1110, and may supplement a difference between the processing rates of the core unit 1110 and an external apparatus. Further, the primary storage unit 1121 of the cache memory unit 1120 may be located in the core unit 1110, and the secondary storage unit 1122 and the tertiary storage unit 1123 may be formed in the outside of the core unit 1110 to enforce a function to compensate a processing rate.

The bus interface 1130 is a unit that may couple the core unit 1110 and the cache memory unit 1120 to efficiently transmit data.

The processor 1100 according to the embodiment may include a plurality of core units 1110, and the core units 1110 may share the cache memory unit 1120. The core units 1110 and the cache memory unit 1120 may be coupled through the bus interface 1130. The core units 1110 may have the same configuration as the configuration of the above-described core unit 1110. When the core units 1110 are provided, the primary storage unit 1121 of the cache memory unit 1120 may be formed in each of the core units 1110 corresponding to the number of core units 1110, and the secondary storage unit 1122 and the tertiary storage unit 1123 may be formed in one body in the outsides of the core units 1110 to be shared through the bus interface 1130. Here, the processing rate of the primary storage unit 1121 may be greater than those of the secondary and tertiary storage units 1122 and 1123.

The processor 1100 according to the embodiment may further include an embedded memory unit 1140 that may store data, a communication module unit 1150 that may transmit and receive data to and from an external apparatus in a wired manner or a wireless manner, a memory control unit 1160 that may drive an external storage device, and a media processing unit 1170 that may process data processed in the processor 1100 or data input from an external apparatus and may output a processing result to an external interface device. The processor may further include a plurality of modules. At this time, the modules may transmit data to and receive data from the core unit 1110 and the cache memory unit 1120, and between the modules through the bus interface 1130.

The embedded memory unit 1140 may include a volatile memory or a nonvolatile memory. The volatile memory may include a dynamic random access memory (DRAM), a mobile DRAM, a static random access memory (SRAM), and the like, and the nonvolatile memory may include a read only memory (ROM), a NOR flash memory, a NAND flash memory, a phase-change random access memory (PRAM), a resistive RAM (RRAM), a spin transfer torque RAM (STTRAM), a magnetic RAM (MRAM), and the like. The semiconductor device according to the embodiment may be applied to the embedded memory unit 1140.

The communication module unit 1150 may include all modules such as a module that may be coupled to a wired network and a module that may be coupled to a wireless network. The wired network module may include a local area network (LAN), a universal serial bus (USB), Ethernet, a power line communication (PLC), and the like, and the wireless network module may include Infrared Data Association (IrDA), Code Division Multiple Access (CDMA), Time Division Multiple Access (TDMA), Frequency Division Multiple Access (FDMA), a wireless LAN, Zigbee, a Ubiquitous Sensor Network (USN), Bluetooth, Radio Frequency Identification (RFID), Long Term Evolution (LTE), Near Field Communication (NFC), Wireless Broadband Internet (Wibro), High Speed Downlink Packet Access (HSDPA), Wideband CDMA (WCDMA), Ultra WideBand (UWB), and the like.

The memory control unit 1160 may manage data transmitted between the processor 1100 and an external apparatus that may operate according to a different communication standard from the processor 1100. The memory control unit 1160 may include a variety of memory controllers, or a controller that may control Integrated Device Electronics (IDE), Serial Advanced Technology Attachment (SATA), a Small Computer System Interface (SCSI), a Redundant Array of Independent Disks (RAID), a solid state disk (SSD), External SATA (eSATA), Personal Computer Memory Card International Association (PCMCIA), a USB, a secure digital (SD) card, a mini secure digital (mSD) card, a micro SD card, a secure digital high capacity (SDHC) card, a memory stick card, a smart media card (SM), a multi media card (MMC), an embedded MMC (eMMC), a compact flash (CF) card, and the like.

The media processing unit 1170 may be a unit that may process data processed in the processor 1100 or data input from an external input device and may output a processing result to an external interface device so that the processing result may be transferred in video, a voice, and other types. The media processing unit 1170 may include a GPU, a DSP, a HD audio, a high definition multimedia interface (HDMI) controller, and the like.

Figure 8:
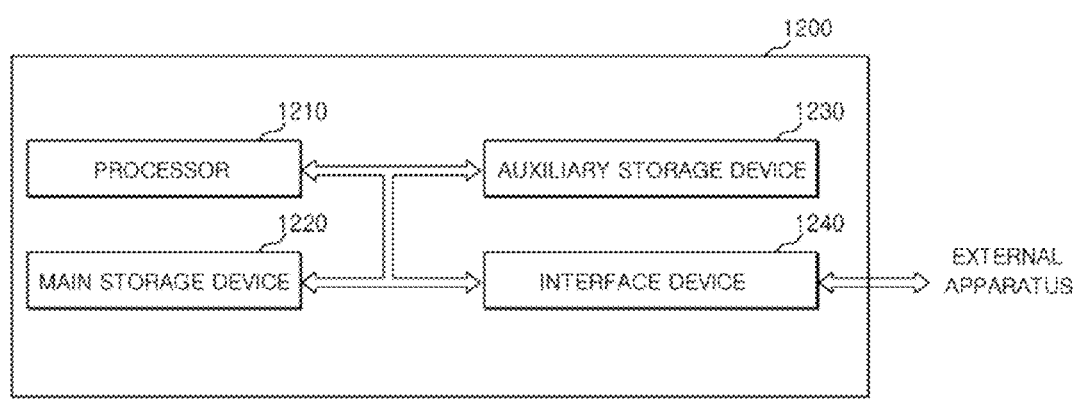
FIG. 8 is a block diagram illustrating a system according to an embodiment of the inventive concept.

As illustrated in FIG. 8, a system 1200 to which the semiconductor device according to an embodiment of the inventive concept is applied is a data processing apparatus. The system 1200 may perform input, processing, output, communication, storage, and the like to perform a series of operations on data, and include a processor 1210, a main storage device 1220, an auxiliary storage device 1230, and an interface device 1240. The system according to the embodiment may be a variety of electronic systems that may operate using a processor, such as a computer, a server, a personal digital assistant (PDA), a portable computer, a web tablet, a wireless phone, a mobile phone, a smart phone, a digital music player, a portable multimedia player (PMP), a camera, a global positioning system (GPS), a video camera, a voice recorder, Telematics, an audio visual (AV) system, or a smart television.

The processor 1210 is a core configuration of the system that may control interpretation of an input command and processing such as an operation, comparison, and the like of data stored in the system, and may be formed of a MPU, a CPU, a single/multi core processor, a GPU, an AP, a DSP, or the like.

The main storage unit 1220 is a storage place that may move and execute a program or data from the auxiliary storage device 1230 and may execute the program or the data, when the program is executed. The main storage device 1220 retains the stored content in power off, and may include the semiconductor device according to the above-described embodiment. The main storage device 1220 may to include a semiconductor device having a lateral channel structure in which a common source node is formed in a line shape.

The main storage device 1220 according to the embodiment may further include an SRAM or a DRAM of a volatile memory type in which all contents are erased in power off. Alternatively, the main storage device 1220 may not include the semiconductor device according to the embodiment but may include an SRAM or a DRAM of a volatile memory type in which all contents are erased in power off.

The auxiliary storage device 1230 is a storage device that may store a program code or a data. The auxiliary storage device 1230 may have a lower data processing rate than that of the main storage device 1220, but may store a large amount of data and include the semiconductor device according to the above-described embodiment. The auxiliary storage unit 1230 may also include a semiconductor device having a lateral channel structure in which a common source is formed in a line shape.

An area of the auxiliary storage device 1230 according to the embodiment may be reduced, to reduce a size of the system 1200 and increase portability of the system 1200. Further, the auxiliary storage device 1230 may further include a data storage system, such as a magnetic tape and a magnetic disc using a magnetism, a laser disc using light, a magneto-optical disc using a magnetism and light, an SSD, a USB memory, a SD card, a mSD card, a micro SD card, a SDHC card, a memory stick card, a smart media card, a MMC card, an eMMC, or a CF card. Unlike this, the auxiliary storage device 1230 may not include to the semiconductor device according to the above-described embodiment but may include a data storage system, such as a magnetic tape and a magnetic disc using a magnetism, a laser disc using light, a magneto-optical disc using a magnetism and light, an SSD, a USB memory, a SD card, a mSD card, a micro SD card, a SDHC card, a memory stick, card, a smart media card, a MMC card, an eMMC, or a CF card.

The interface device 1240 may exchange a command and data of an external apparatus with the system of the embodiment, and may be a keypad, a keyboard, a mouse, a speaker, a mike, a display, a variety of Human Interface Devices (HIDs), or a communication device. The communication device may include all modules such as a module that may be coupled to a wired network or a module that may be coupled to a wireless network. The wired network module may include a LAN, a USB, Ethernet, a PLC, and the like, and the wireless network module may include IrDA, CDMA, TDMA, FDMA, a wireless LAN, Zigbee, a USN, Bluetooth, RFID, LTE, NFC, Wibro, HSDPA, WCDMA, UWB, and the like.

The above embodiment of the present invention is illustrative and not limitative. Various alternatives and equivalents are possible. The invention is not limited by the embodiment described herein. Nor is the invention limited to any specific type of semiconductor device. Other additions, subtractions, or modifications are obvious in view of the present disclosure and are intended to fall within the scope of the appended claims.

What is claimed is:

1. A semiconductor device, comprising:
   a semiconductor substrate;
   an insulating layer formed on the semiconductor substrate;
   an active line including a source region and a drain region formed on the insulating layer;
   a gate electrode located on a portion of the active line, corresponding to a region between the source region and the drain region, and extending to a direction substantially perpendicular to the active line;
   a line-shaped common source node formed to be electrically coupled to the source region and extending substantially in parallel to the gate electrode;
   variable resistors formed over the source region and the drain region, respectively; and
   a heating electrode formed between the drain region and the variable resistor which is formed over the drain region,
   wherein the variable resistor over the heating electrode is electrically coupled to the heating electrode, and the variable resistor over the line-shaped common source node is electrically insulated from the line-shaped common source node.

2. The semiconductor device of claim 1, further comprising a hard mask layer formed on the gate electrode,
   wherein the hard mask layer fills a space between the variable resistor on the heating electrode and the variable resistor on the line-shaped common source node.

3. The semiconductor device of claim 1, further comprising an insulating layer interposed between the gate electrode and the active line, between the gate electrode and the line-shaped common source node, and between the gate electrode and the heating electrode.

4. The semiconductor device of claim 1, wherein the gate electrode includes one or more materials selected from the group consisting of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, TiSi, TaSi, TiW, TiON, TiAlON, WON, and TaON.

5. A semiconductor device, comprising:
   a semiconductor substrate;
   a plurality of active lines floating over the substrate and extending in parallel to a first direction;
   a plurality of gate electrodes formed on each of the active lines and extending in parallel to a second direction that is substantially perpendicular to the first direction;
   a plurality of line-shaped common source nodes formed on each of the active lines, extending in parallel to the second direction, and located between the gate electrodes;
   drain regions formed in each of the active lines at one sides of the gate electrodes;
   source regions formed in each of the active lines at the other sides of the gate electrodes;
   heating electrodes formed on the drain regions, respectively;
   first variable resistors formed on the heating electrodes, respectively;
   second variable resistors formed over the line-shaped common source nodes, respectively; and
   spacer layers formed between the second variable resistors and the line-shaped common source nodes, respectively.

6. The semiconductor device of claim 5, wherein each of the line-shaped common source nodes is formed to be electrically coupled to a corresponding one of the source regions, and to be electrically coupled to the semiconductor substrate.

7. The semiconductor device of claim 5, further comprising a first insulating layer interposed between the semiconductor substrate and the active lines.

8. The semiconductor device of claim 7, further comprising second insulating layers interposed between the gate electrodes and the active lines, between the gate electrodes and the common source nodes, and between the gate electrodes and the heating electrodes.

9. The semiconductor device of claim 5, further comprising hard mask layers formed on the gate electrodes,
   wherein the hard mask layers fill spaces between the first variable resistors on the heating electrodes and the second variable resistors on the line-shaped common source nodes, respectively.

10. The semiconductor device of claim 5, wherein each of the gate electrodes includes one or more materials selected from the group consisting of W, Cu, TiN, TaN, WN, MoN, NbN, TiSiN, TiAlN, TiBN, ZrSiN, WSiN, WBN, ZrAlN, MoSiN, MoAlN, TaSiN, TaAlN, Ti, Mo, Ta, TiSi, TaSi, TiW, TiON, TiAlON, WON, and TaON.

* * * * *